US011222974B2

(12) United States Patent
Peake

(10) Patent No.: US 11,222,974 B2
(45) Date of Patent: Jan. 11, 2022

(54) TRENCH GATE SEMICONDUCTOR DEVICE AND METHOD OF MANUFACTURE

(71) Applicant: NEXPERIA B.V., Nijmegen (NL)

(72) Inventor: Steven Peake, Nijmegen (NL)

(73) Assignee: Nexperia B.V., Nijmegen (NL)

(*) Notice: Subject to any disclaimer, the term of this patent is extended or adjusted under 35 U.S.C. 154(b) by 0 days.

(21) Appl. No.: 16/774,436

(22) Filed: Jan. 28, 2020

(65) Prior Publication Data
US 2020/0243679 A1 Jul. 30, 2020

(30) Foreign Application Priority Data

Jan. 29, 2019 (EP) .................................... 19154245

(51) Int. Cl.
H01L 29/78 (2006.01)
H01L 29/417 (2006.01)
H01L 29/423 (2006.01)
H01L 29/66 (2006.01)

(52) U.S. Cl.
CPC .... H01L 29/7813 (2013.01); H01L 29/41741 (2013.01); H01L 29/4236 (2013.01); H01L 29/66734 (2013.01)

(58) Field of Classification Search
CPC ........................ H01L 29/7813; H01L 29/4236
See application file for complete search history.

(56) References Cited

U.S. PATENT DOCUMENTS

| 2004/0209425 | A1 | 10/2004 | Harada | |
|---|---|---|---|---|
| 2006/0273386 | A1* | 12/2006 | Yilmaz | H01L 29/7827 257/330 |
| 2008/0199995 | A1* | 8/2008 | Woolsey | H01L 29/4236 438/259 |
| 2009/0272982 | A1* | 11/2009 | Nakamura | H01L 29/66068 257/77 |
| 2010/0044785 | A1* | 2/2010 | Murphy | H01L 29/66727 257/330 |
| 2011/0133258 | A1 | 6/2011 | Chen | |
| 2011/0169103 | A1* | 7/2011 | Darwish | H01L 29/7835 257/409 |
| 2011/0254088 | A1* | 10/2011 | Darwish | H01L 29/66727 257/340 |
| 2013/0299898 | A1 | 11/2013 | Wang et al. | |
| 2017/0012109 | A1* | 1/2017 | Akagi | H01L 21/0475 |
| 2018/0226480 | A1* | 8/2018 | Okuda | H01L 21/26586 |

(Continued)

OTHER PUBLICATIONS

European Search Report for corresponding application EP19154245. 5, dated Jul. 19, 2019, 8 pages.

*Primary Examiner* — Douglas W Owens
(74) *Attorney, Agent, or Firm* — Ohlandt, Greeley, Ruggiero & Perle, LLP

(57) ABSTRACT

This disclosure relates to a power semiconductor device and a method of manufacturing the same, including: a semiconductor layer defining a first major surface and a drift region and a trench extending from the first major surface into the semiconductor layer. The trench includes a gate electrode surrounded by a gate dielectric configured and arranged to electrically isolate the gate electrode from the semiconductor layer; and a source region extending from the first major surface and abutting a top side-wall portion of the trench, and the source region extends to a depth corresponding to a top surface of the gate electrode.

16 Claims, 6 Drawing Sheets

(56) References Cited

U.S. PATENT DOCUMENTS

| | | | |
|---|---|---|---|
| 2018/0269287 A1* | 9/2018 | Yoshimura | H01L 29/083 |
| 2018/0366569 A1* | 12/2018 | Zeng | H01L 29/1095 |
| 2019/0198660 A1* | 6/2019 | Kachi | H01L 29/0619 |
| 2019/0237576 A1* | 8/2019 | Qiao | H01L 29/7825 |
| 2020/0176580 A1* | 6/2020 | Siemieniec | H01L 29/1095 |
| 2020/0212219 A1* | 7/2020 | Kim | H01L 29/872 |

\* cited by examiner

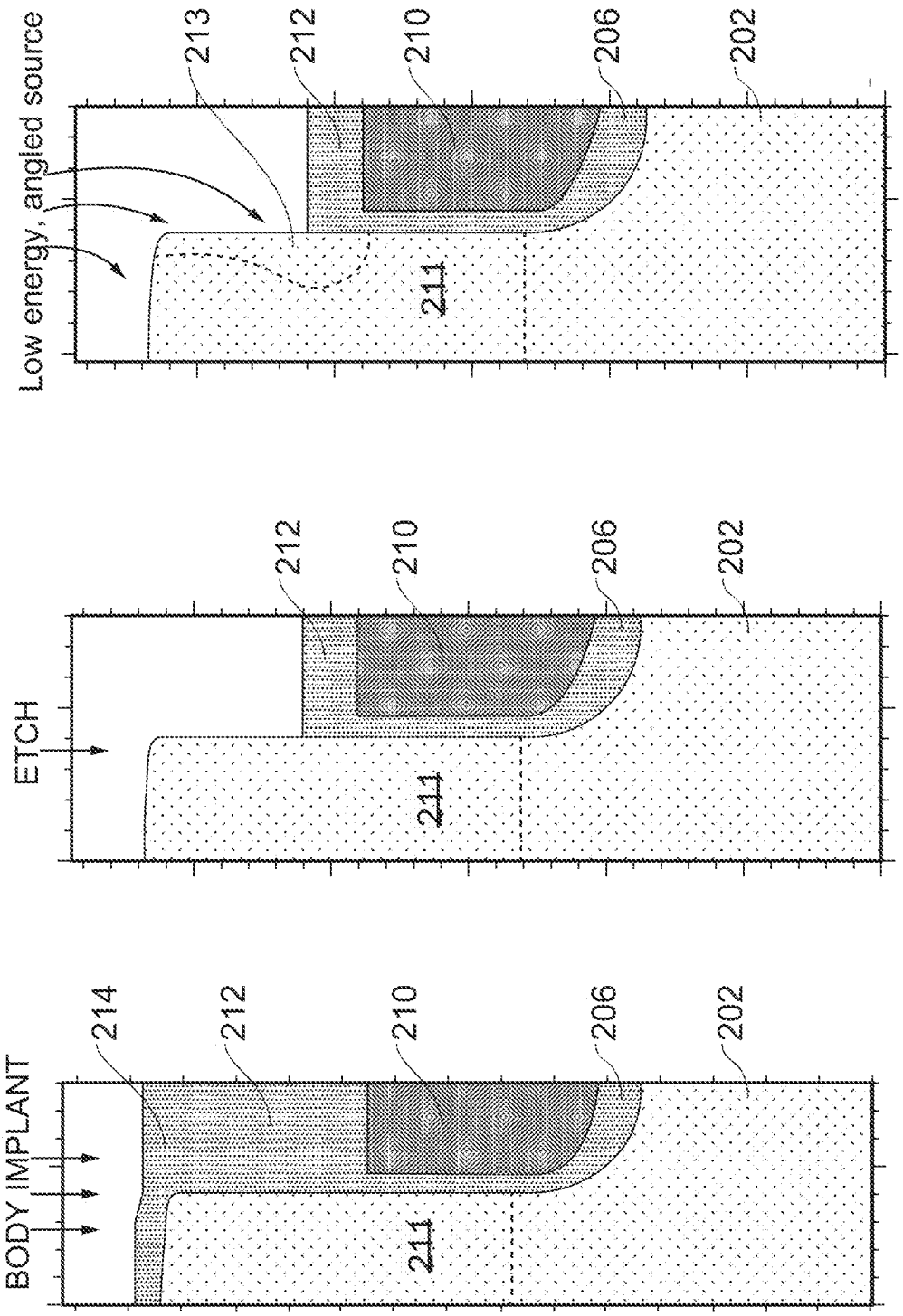

TRENCH GATE SEMICONDUCTOR DEVICE AND METHOD OF MANUFACTURE

CROSS REFERENCE TO RELATED APPLICATIONS

This application claims the benefit under 35 U.S.C. § 119(a) of European Application No. 19154245.5 filed Jan. 29, 2019 the contents of which are incorporated by reference herein in their entirety.

BACKGROUND OF THE DISCLOSURE

1. Field of the Disclosure

The present disclosure relates to a semiconductor device. In particular, this disclosure relates to a discrete trench-gate MOSFET semiconductor device and associated method of manufacture.

2. Description of the Related Art

Trench-gate semiconductor devices typically comprise a source region towards a first major surface of the device and a drain region formed on a second major surface, opposite to the first major surface. The source and drain region have the same conductivity type. A body region is arranged between the source and drain, which has an opposite conductivity type to that of the source and drain region. To turn-on the device, so that it conducts an electrical current between the source and drain, a channel must be created through the body region. To facilitate creation of the channel, a trench gate electrode is provided close to, but not in contact with, the body region in trench within the device.

The trench is typically lined with an oxide, to electrically isolate the gate electrode from the body region. Providing a bias at the gate produces an electrical field which extends into and locally depletes, and inverts, the body region.

Trench-gate semiconductor devices are capable of high voltage operation, that is in the region of 100V. In addition, such devices are also capable of high reverse bias up to 250V. between the source and drain without the device breaking down or passing any significant reverse current. This can be achieved, by including a drift region between the drain region and the body region, where the drift region has the same conductivity type as the source region and the drain region, albeit at a lower doping concentration. This drain region forms a p-n junction at the interface with the body region which blocks high reverse bias currents. For n-channel devices the drain is positive relative to the source. If the source is positive relative to the drain, then the body-drain junction becomes biased and current is conducted via drain and source. Conversely, for p-channel devices the drain is negative relative to the source. If the source is negative relative to the drain, then the body-drain junction again conducts current. The breakdown voltage is dependent upon the thickness of the drift region; where, the greater the thickness, the higher the breakdown voltage.

The above arrangement is illustrated generally in FIG. 1, in which the trench-gate semiconductor device comprises the source region 1 at first major surface 11 thereof, and a substrate forming the drain region 2 of the device. The body region 3, and drift region 6 is arranged between the source region 1 and drain region 2. A trench 4 extends downward from the first major surface 11, through the source region 1 and body region 3 and terminates in the drift region 6. Sidewalls and the bottom of the trench 4 are lined with an insulating material 5 to physically and electrically isolate the gate 8 which lies within trench 4 from the surrounding regions. A moat 9 is formed through the source region 10, terminating in the body region 3 so as to allow a low resistance Ohmic electrical contact to be made between the source region 10 and body region 3.

When compared to conventional lateral MOSFET devices, such as lateral DMOS, in vertical trench-gate semiconductor devices such as the type described above the channel regions are designed along the vertical walls of the trenches, rather than laterally, which therefore allows for a high density of channels (two for each trench) per unit area of the device. However, a limiting factor on increasing of the density of trenches is the width of the moat 9 regions, which takes up device area, and ensuring that the distance from moat 9 to trench gate 8 is above the tolerance of the alignment process between moat 9 and trench gate 8. The width of the moat regions and the tolerance of the alignment thus limit the maximum number of trench cell per device unit area.

SUMMARY

Various example embodiments are directed to issues such as those addressed above and/or others which may become apparent from the following disclosure concerning for example improving the density of channels per unit area of a trench gate semiconductor device.

In certain example embodiments, aspects of the present disclosure involve a source contact is formed above the gate thus allowing for removal of conventional moat region configurations for contacting the source and body regions. In addition the source contact arranged on a top surface the gate dielectric and which is electrically connected the source region and the body region allows the source region to be aligned with the gate electrode.

According to embodiments there is provided a discrete power semiconductor device, comprising: a semiconductor layer defining a first major surface and comprising a drift region; a trench extending from the first major surface into the semiconductor layer, wherein the trench comprises a gate electrode surrounded by a gate dielectric configured and arranged to electrically isolate the gate electrode from the semiconductor layer; and a source region extending from the first major surface and abutting a top side-wall portion of the trench, wherein the source region extends to a depth corresponding to a top surface of the gate electrode.

The semiconductor device may further comprise a body region extending from the first major surface into the semiconductor layer; wherein the body region abuts the source region at an upper portion thereof and abuts the trench at a lower portion thereof.

The source contact may be electrically connected to the source region and the body region and/or the source contact may be configured and arranged on an upper portion of the gate dielectric.

The body region may abut the source region on a side opposite to the side of the source region which abuts the trench.

The semiconductor device may further comprise a semiconductor substrate wherein the semiconductor layer is configured and arranged on the semiconductor substrate and the trench may extends into and terminate in a drift region of the semiconductor layer.

According to embodiments there is also provided a method of manufacturing a power semiconductor device, the method comprising: forming a semiconductor layer defining a first major surface and comprising a drift layer; forming a trench extending from the first major surface into the semiconductor layer; forming a gate electrode surrounded by a gate dielectric configured and arranged to electrically isolate the gate electrode from the semiconductor layer; and forming a source region extending from the first major surface and abutting a top side-wall portion of the trench, wherein the source region extends to a depth corresponding to a top surface of the gate electrode.

The method of manufacturing the semiconductor device may also comprise forming a body region extending from the first major surface into the semiconductor layer; wherein the body region is formed to abut the source region at an upper portion thereof and abut the trench at a lower portion thereof.

The method may also comprise forming a source contact electrically connected to the source region and the body region and forming the source contact is on an upper portion of the gate dielectric.

The body region may be formed to abut the source region on a side opposite to the side of the source region which abuts the trench. The semiconductor layer may be formed on the semiconductor substrate and the trench may be formed to extend into and terminate in a drift region of the semiconductor layer.

As a result, the skilled person will see that the arrangement of trench semiconductor device and corresponding method of manufacture according to the above described embodiments can achieve a higher density of active cells per unit area.

BRIEF DESCRIPTION OF THE DRAWINGS

So, that the manner in which the features of the present disclosure can be understood in detail, a more particular description is made with reference to embodiments, some of which are illustrated in the appended figures. It is to be noted, however, that the appended figures illustrate only typical embodiments and are therefore not to be considered limiting of its scope. The figures are for facilitating an understanding of the disclosure and thus are not necessarily drawn to scale. Advantages of the subject matter claimed will become apparent to those skilled in the art upon reading this description in conjunction with the accompanying figures, in which like reference numerals have been used to designate like elements, and in which:

FIGS. 2a to 2l illustrates the various process steps for fabrication of a trench-gate semiconductor device according to the embodiments.

DETAILED DESCRIPTION

Figure 1:
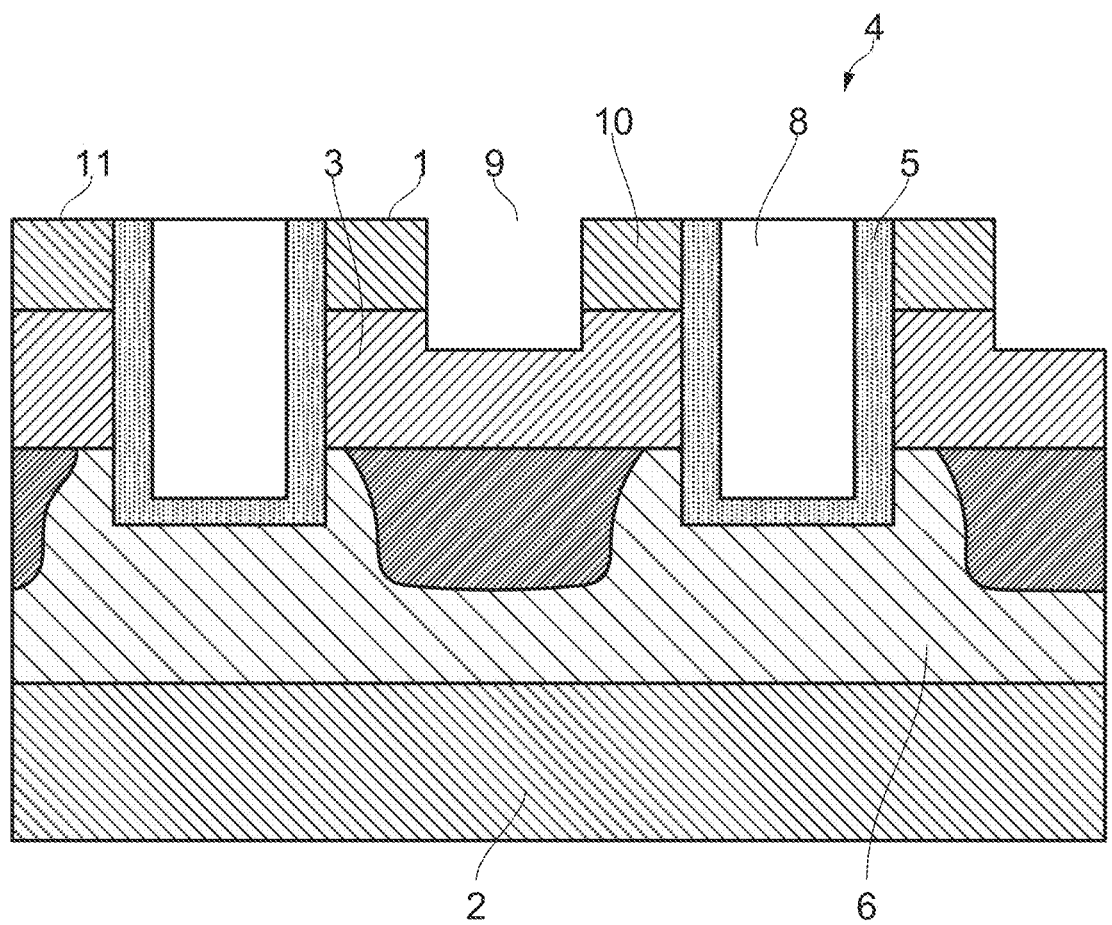
FIG. 1 shows a cross-section through portion of a known trench-gate semiconductor device.
Figure 2C:
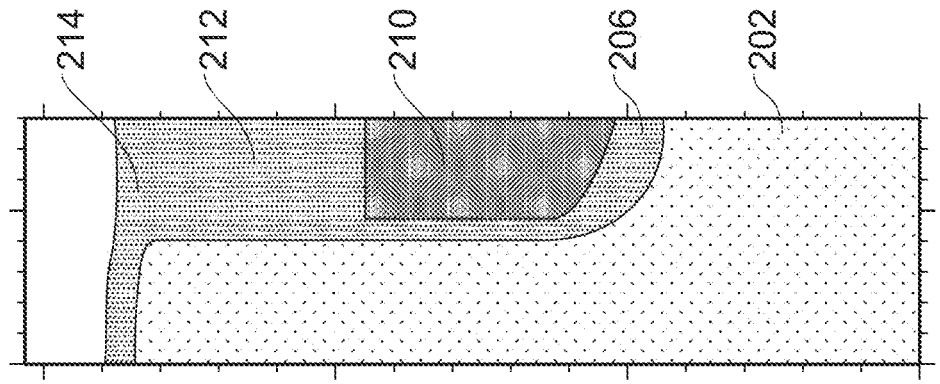
Figure 2B:
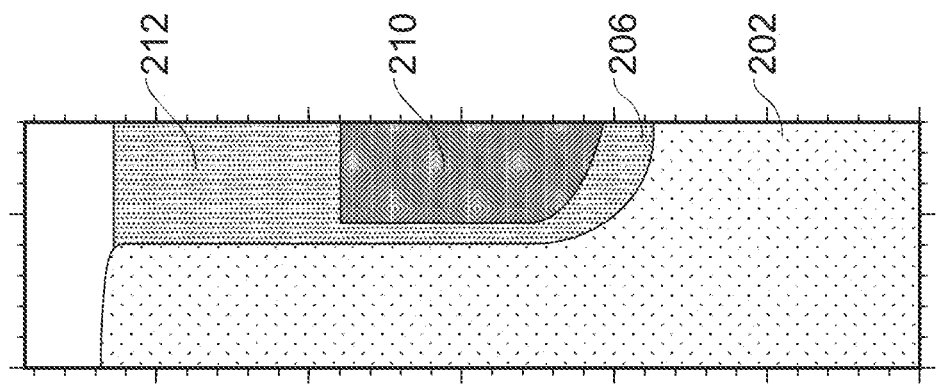
Figure 2A:
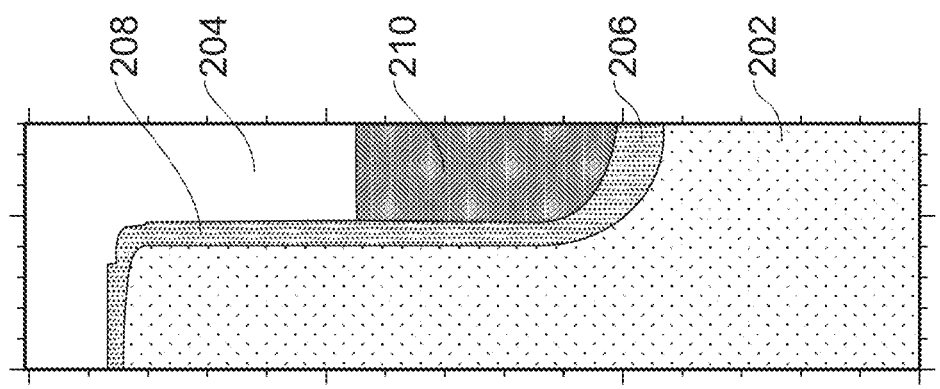

A trench-gate semiconductor device according to the embodiments is manufactured according to the process steps as illustrated in FIGS. 2a to 2l. Prior to the process of FIG. 2a, a semiconductor layer may be formed on a semiconductor substrate (not illustrated) using known techniques such as epitaxial growth or deposition. Typically, the semiconductor layer is formed of silicon and is formed of the same conductivity type as the semiconductor substrate, for example n-type. Following formation of the semiconductor layer, which defines a drift region 202 of the trench-gate semiconductor device, a gate trench 204 is formed through the top major surface of the semiconductor layer forming the drift region 202, as illustrated in FIG. 2a. The gate trench 204, which will later define the gate of the device may be formed by any appropriate etching technique such that it terminates in the drift region 202, that is, it does not extend into the semiconductor substrate. The gate trench 204 comprises opposing side walls and a bottom.

Following formation of the gate trench 204, an oxide layer 206, known as a thick bottom oxide (TBO) 206, is formed bottom of the gate trench 204. The TBO 206 may be formed for example by local oxidation of silicon (LOCOS). Likewise, the side walls of the gate trench 204 is lined with a sidewall oxide 208. The sidewall oxide 208 may extend to cover the top major surface of the semiconductor layer forming the drift region 202. Following formation of the side wall 206 oxide and thick bottom oxide 208, a gate electrode 210 is formed in the gate trench 204.

The gate electrode 210 may be formed by appropriate process such as deposition of poly-silicon. The thick bottom oxide 206 and the sidewall oxide 208 collectively form a gate oxide (first oxide layer) configured and arranged to electrically insulate the gate electrode 210 from the surrounding drift regions 202 and any subsequent semiconductor regions formed, as discussed in more detail below.

Turning now to FIG. 2b, the process continues by depositing and covering the gate electrode 210 with a gate dielectric oxide layer 212 (second oxide layer), which may be a Tetraethyl Orthosilicate (TEOS) layer for example, however the skilled person will appreciate that any suitable oxide dielectric may be used. The gate dielectric oxide layer 212 is then planarised so that a top surface thereof is substantially level with the top major surface of the semiconductor layer forming the drift region 202. This step of planarisation may also remove any sidewall oxide 208 formed on the top major surface of the drift region 202. Planarisation may be achieved by any appropriate process such as chemical mechanical polishing (CMP). Planarisation of the gate dielectric oxide layer 212 provides a flat surface to achieve top planarity of the gate dielectric.

Following the planarisation process, and as illustrated in FIG. 2c, a screen oxide layer 214 (third oxide layer) is formed on the oxide layer 212 and the top major surface of the semiconductor layer. The screen oxide layer 214 may be a thermally grown layer, TEOS, or any other suitable oxide dielectric. The screen oxide layer 214 acts as an implant pad oxide, in that it is arranged to minimise high energy implant damage during formation of the body, as discussed below. Such implant damage can result in unwanted dislocations at the top major surface of the semiconductor layer.

When the screen oxide layer 214 in the gate trench is etched back prior to the source implant part of the screen oxide will be removed. Optionally, an additional screen oxide layer (not illustrated) may be formed prior to the source implant.

A body region 211 of the trench-gate semiconductor device is then formed in the semiconductor layer as illustrated in FIG. 2d. The formation of the body region 211 may be achieved implanting by a p-type species into the (n-type) drift region 202 using, for example, a boron implant. The body region 211 extends to a depth corresponding to the side walls of the gate trench 204. As mentioned above the body region 211 is formed such that during operation a channel region is created through the body region adjacent to the gate electrode 210. As mentioned, the screen oxide layer 214 prevents implant damage during formation of the body region 211.

As illustrated in FIG. 2e, and following formation of the body region 211, the screen oxide layer 214 is removed by etching from the top surface of the semiconductor layer and the gate trench 204. In addition the gate dielectric oxide layer 212 is partially removed, by for example etching, from the gate trench 204. Also, the sidewall oxide 208 is partially removed from the side walls of the gate trench 204, leaving a layer of the gate oxide dielectric layer 212 covering the gate electrode 210. In this way, the side walls of the gate trench 204 are exposed for later formation of the source region 213, as discussed below.

The thickness of the remaining gate dielectric oxide layer 212 above the gate electrode 210 may be approximately 200 nm, but this is dependent on the required depth of the source implant. The source region 213 is aligned to the gate and is implanted in semiconductor layer corresponding to the side walls of the gate trench to be at least as deep as the level of the top gate electrode 210. The gate dielectric oxide layer 212 is arranged to define the extent of the source implant depth. If gate dielectric oxide layer 212 is too thick the source will not be correctly defined and the source implant will not reach the level of the top gate electrode 210. If the gate dielectric oxide layer 212 is too thin, the source may go too deep resulting in a shorter channel region depth. In this regard, the skilled person will see that thickness of the remaining gate dielectric oxide layer 212 is a design variable and is dependent on the energy of the implant and the required device architecture.

Referring now to FIG. 2f, the source region 213 of the trench-gate semiconductor device is then formed in the semiconductor layer region corresponding to an upper portion of the body region 211 abutting the gate trench 204. The formation of the source region 213 may be achieved by implanting an n-type species into an upper portion of the gate trench 204 side wall of the previously formed body region 211. The upper portion of the side wall that exposed by the oxide etching process discussed above with respect to FIG. 2e. Implantation of the n-type species may be achieved by an angled implantation, that is not vertical with respect to the top surface of the semiconductor layer. The implant may be any appropriate n-type species such as arsenic. The angled implant allows the n-type species to reach the exposed sidewalls of the gate trench 204, thus forming the source region 213.

Figure 2I:
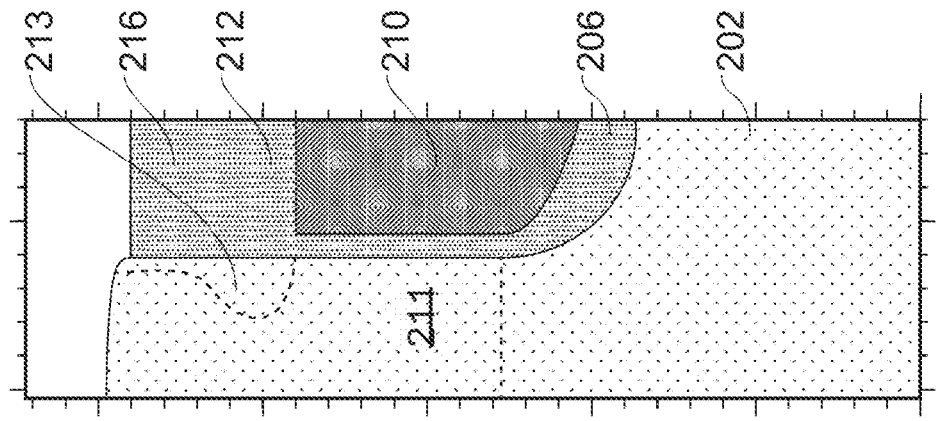

Following formation of the source region 213, an oxide plug 216 (fourth oxide) is formed in the gate trench 204 and planarised by for example CMP. The oxide plug 216 is configured to define the source metallisation contact region (discussed in more detail below) and to align the later formed source implant to the oxide plug 216 after later etching of the oxide plug 216. In this way there is no requirement for a photolithography step for the source implant because the extent of the source is defined by the oxide plug 216. As illustrated in FIG. 2g, the oxide plug 216 is deposited and then planarised so that the top major surface of the semiconductor layer, in which the source region 213 is formed, is exposed.

Figure 2H:
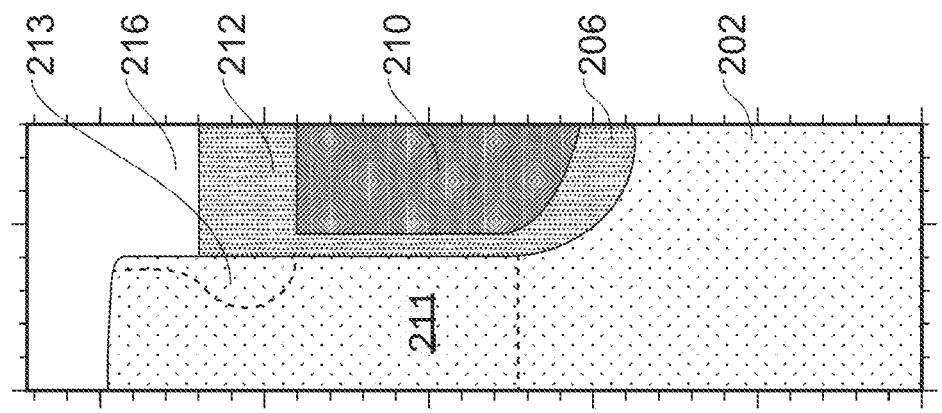
Figure 2G:
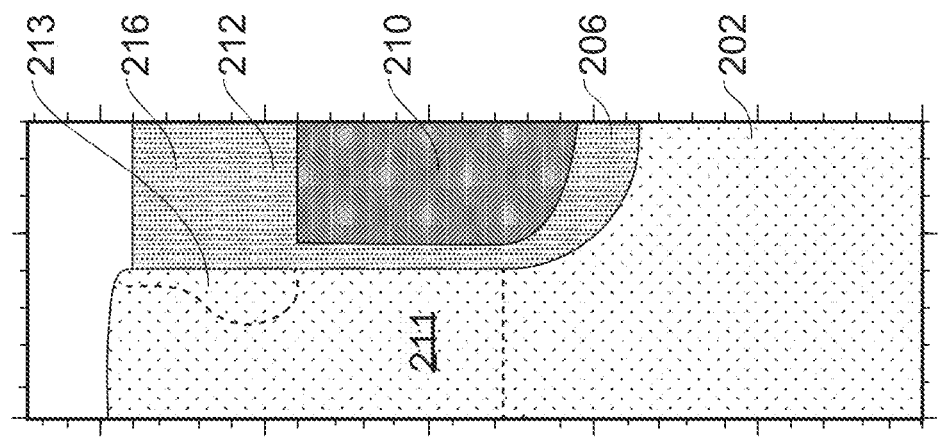

The oxide plug 216 is then partially removed, by for example etching, from the gate trench 204, that is it is removed from the side walls of the gate trench 204, leaving layers of the oxide layers 212 and 216 formed over the gate electrode 210 as illustrated in FIG. 2h. In this step, the oxide plug 216 is etched to a level below the top major surface of the silicon layer. This allows for the later removal (as discussed below with respect to FIG. 2i) of a top portion of the top major surface of the silicon layer such that it is ultimately level with the oxide plug 216 and to remove a surface of the silicon and replace it with the source contact implant (discussed below). The source contact implant is of lower dose than the source region implant, so to effectively short the body region and source region of the device. The source region implant on the surface of the silicon has to be removed so there is a short.

As illustrated in FIG. 2i, the top major surface of the semiconductor layer is then etched back in order to remove any high dose n-type species. The oxide plug 216 may act as a mask and provides a surface to prevent reflection of the implant during formation of the source contact area 215 from the plug onto the sidewall of the silicon. The oxide plug 216 also acts to prevent over-doping of the source contact area by reducing the dose of the implanted species. Furthermore, the mask prevents the implanted species from penetrating deeply in to the channel region, which can result in deviation of the device threshold voltage due to increasing doping of the channel region. Additionally, source contact area 215 implant will not over-dope the source region 213 implant but it will have the net effect of reducing the doping of the source region which will increase the contact resistance.

Figure 2L:
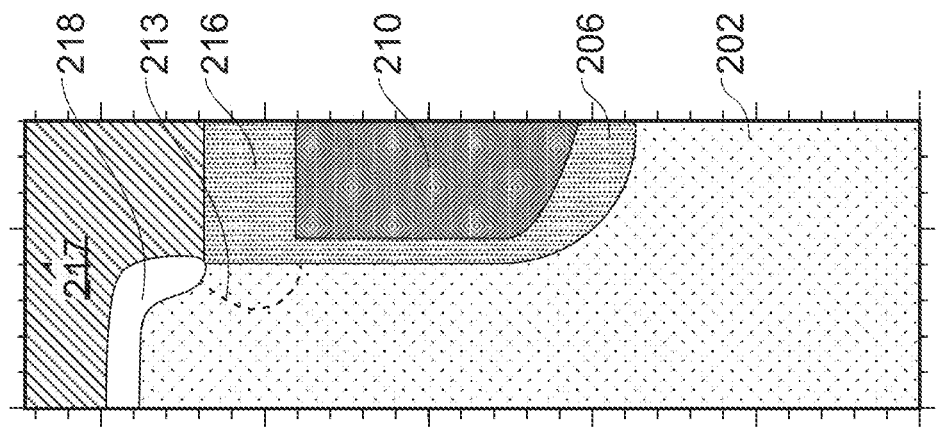
Figure 2K:
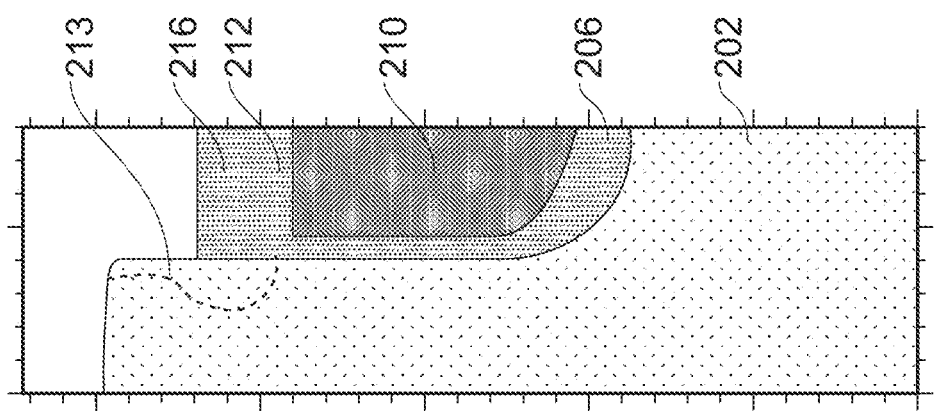
Figure 2J:
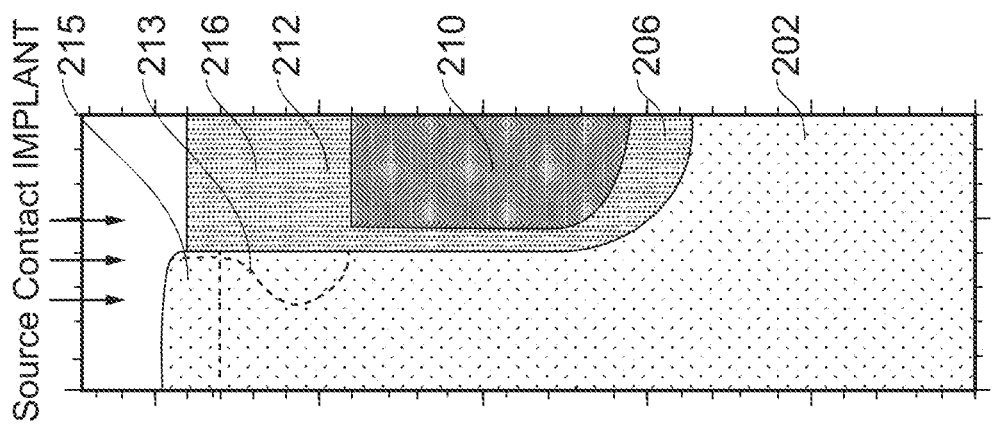

Following the etching step of FIG. 2i, the source contact area 215 is formed at the top major surface of the semiconductor layer corresponding to the source region 213 and body region 211 at the top major surface, as illustrated in FIG. 2j. The formation of the source contact area 215 may be achieved by implanting an p-type species directly into the semiconductor layer. This implant may be achieved, for example, by an implant of boron/fluorine ($BF_2$). The source region 213 and source contact area 215 are electrically connected via a top-side source contact metallisation. This connection is only effective if there is low contact resistance and that low contact resistance is achieved via the high dose of the p-type species of the contact area 215 implant and the source region 213 implant.

Following the source contact area 215 formation of FIG. 2j, the oxide plug 216 is then etched to allow for formation of the source contact metallisation (discussed below), as illustrated in FIG. 2k. This results that the source contact metallisation area to the source region 213 is large enough to ensure electrical connection thereto.

Referring now to FIG. 2l, the source metallisation 217 is then formed on the top major surface of the semiconductor layer corresponding to the source region 213 and on the oxide plug 216. The source metallisation 217 may be aluminium or other appropriate metal and may be formed by any appropriate process. The source metallization 217 contacts the entire top surface of the top surface of the semiconductor layer and fills the area between the oxide plug 216 and the silicon surface in the gate trench.

A metal silicide 218, such as tungsten silicide, may be formed on the top major surface of the semiconductor layer to form a contact area to the source metallization 218. This allows for a reduction of the contact resistance for a given contact area.

Figure 3:
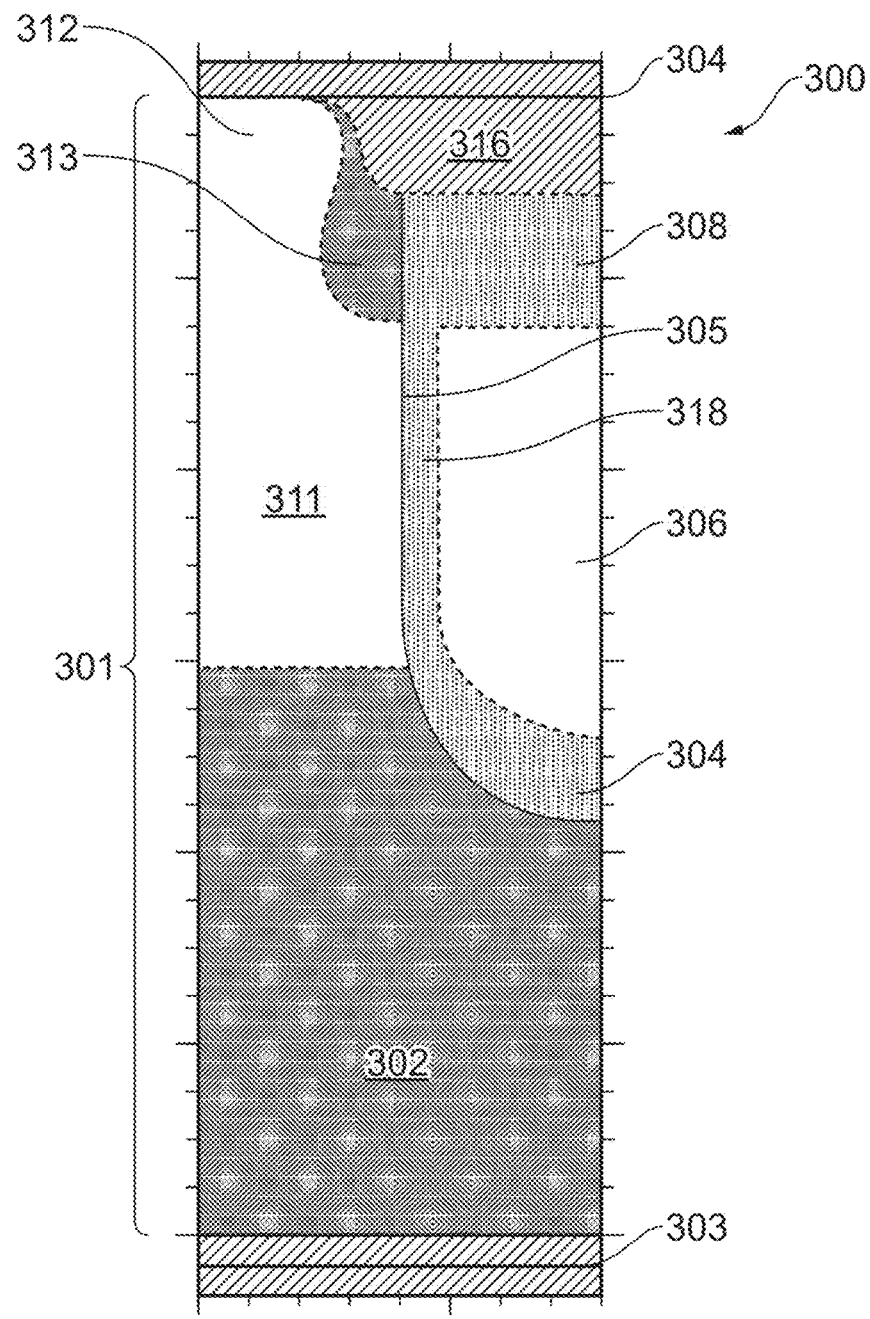
FIG. 3 illustrates a part of the trench-gate semiconductor device according to the embodiments.

Turning now to FIG. 3, a half-cell of the active cell region of trench gate semiconductor device 300 according to the embodiments is illustrated. The skilled person will appreciate the arrangement of FIG. 3 is one half of a full cell and that the trench gate semiconductor device 300 semiconductor device may comprise one or more such cells. The trench gate semiconductor device 300 may comprise a semiconductor layer 301 arranged on a semiconductor substrate 303. The semiconductor layer comprises an n-type drift region 302 formed on an n-type semiconductor substrate 303 which collectively form a drain region of the semiconductor device 300. Whilst not illustrated in FIG. 3, the skilled person will understand that a drain contact may be formed on the semiconductor substrate 303 by any appropriate means.

A gate trench 305 is arranged to extend from a top portion of the semiconductor device 300 into the semiconductor layer 301, and terminating, in the drift region 302. A TBO 304 is formed in the bottom (or base) of the gate trench 305, a side wall oxide 318 is formed on the side walls of the gate trench 305, and gate dielectric 308 is formed at the top of the gate trench 305.

The side wall oxide 318, trench bottom oxide (TBO) 304 and gate dielectric 308 collectively form a dielectric to electrically isolate a gate electrode 306. In this way, the gate electrode 306 is arranged in the gate trench 305 and is surrounded by the respective oxides 304, 308, 318.

The semiconductor device 300 also comprises a p-type body region 311 which, excluding a source region 313 discussed below, extends from a top major surface of the device to a depth corresponding to the side walls of the gate trench 305. In other words, the body region 311 extends into the semiconductor device and terminates at or before the bottom of the gate trench 305. The body region 311 abuts the gate trench 305 along a length of the gate trench 305 starting at a point corresponding to the top of the gate electrode 306 and ending, as mentioned above, at or before the bottom of the gate trench 305. In this way, the body region 311 abuts a source region 313 at an upper portion thereof and abuts the gate trench 305 at a lower portion thereof. This allows for formation, by inversion, of the source to drain conduction channel of semiconductor device 300 during operation.

The n-type source region 313 extends from the top surface of the semiconductor device 300, adjacent to the source contact area 312, and abuts the gate trench 305 along a length of the gate trench 305 from a point corresponding to a top surface of the gate dielectric 308 to a point corresponding a top surface of the gate electrode 306. The depth of the source region 313 into the semiconductor device 300 therefore corresponds to the thickness of a source metallisation 316 (discussed below) and the gate dielectric 308. The source region 313 thus extends to a depth of the gate trench 305 corresponding to a top surface of the gate electrode 306. This arrangement results in a source region 313 which is aligned to the top surface of the gate electrode 306, which results in reduced dynamic gate charge (Qgs) and improves the switching performance of the devices leading, in turn to the trench-gate semiconductor device operating at lower temperature and higher efficiencies.

The source metallisation 316 is thus arranged on the top surface of the gate dielectric 308 and is electrically connected the source region 313 and the body region 311 such that the source region 313 is aligned with the gate electrode 306.

In this way, the skilled person will see that source contact is formed above the gate trench 305 of the semiconductor device 300. This allows for removal of conventional moat region configurations for contacting the source and body regions 311, 313. As a result, the skilled person will see that the arrangement of trench semiconductor device 300 according to the above described embodiments can achieve a higher density of active cells per unit area.

Whist not illustrated, the skilled person will appreciate that contact to the gate polysilicon may be achieved by any appropriate means. By way of example only the gate contact may be made by etching through the gate oxide into the gate electrode and forming appropriate metallisation therein. The skilled person will appreciate that the p-type regions and n-type regions as described above may be juxtaposed without diverting from the inventive concepts of the embodiments described. The above discussion relates to a n-channel device, where the gate is n-type and electrons are the majority carriers. However, the skilled person will also appreciate that the above discussion is also valid for a p-channel devices, where the gate is p-type and holes are the majority carriers.

Particular and preferred aspects of the disclosure are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed disclosure or mitigate against any or all of the problems addressed by the present invention. The applicant hereby gives notice that new claims may be formulated to such features during prosecution of this application or of any such further application derived therefrom. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

The term "comprising" does not exclude other elements or steps, the term "a" or "an" does not exclude a plurality. Reference signs in the claims shall not be construed as limiting the scope of the claims.

What is claimed is:

1. A power semiconductor device, comprising:
    a semiconductor layer defining a first major surface and comprising a drift region;
    a trench extending from the first major surface into the semiconductor layer, wherein the trench comprises a gate electrode surrounded by a gate dielectric configured and arranged to electrically isolate the gate electrode from the semiconductor layer;
    a source region extending from the first major surface and abutting a top side-wall portion of the trench, wherein the source region extends to a depth corresponding to a top surface of the gate electrode; and
    a source contact arranged on a top surface of the gate dielectric above the gate electrode, the source contact abutting a length of the source region extending downward from the first major surface to the top surface of the gate dielectric.

2. The semiconductor device of claim 1, further comprising a body region extending from the first major surface into the semiconductor layer;
    wherein the body region abuts the source region at an upper portion thereof and abuts the trench at a lower portion thereof.

3. The semiconductor device of claim 1, further comprising a body region extending from the first major surface into the semiconductor layer.

4. The semiconductor device of claim 2, further comprising the source contact electrically connected to the source region and the body region.

5. The semiconductor device of claim 1, further comprising a body region extending from the first major surface into the semiconductor layer;
  wherein the body region abuts the source region on a side opposite to the side of the source region which abuts the trench.

6. The semiconductor device of claim 1, further comprising a semiconductor substrate, wherein the semiconductor layer is configured and arranged on the semiconductor substrate.

7. The semiconductor device of claim 1, wherein the trench extends into and terminates in a drift region of the semiconductor layer.

8. A method of manufacturing a power semiconductor device, the method comprising the steps of:
  forming a semiconductor layer defining a first major surface and comprising a drift layer;
  forming a trench extending from the first major surface into the semiconductor layer;
  forming, in said trench, a gate electrode surrounded by a gate dielectric configured and arranged to electrically isolate the gate electrode from the semiconductor layer;
  forming a source region extending from the first major surface and abutting a top side-wall portion of the trench, wherein the source region extends to a depth corresponding to a top surface of the gate electrode; and
  forming a source contact on a top surface of the gate dielectric above the gate electrode so that the source contact abuts a length of the source region extending downward from the first major surface to the top surface of the gate dielectric.

9. The method of claim 8, further comprising the steps of:
  forming a body region extending from the first major surface into the semiconductor layer;
  wherein the body region is formed to abut the source region at an upper portion thereof and abut the trench at a lower portion thereof.

10. The method of claim 8, further comprising
  forming a body region extending from the first major surface into the semiconductor layer; and
  forming the source contact to electrically connect the source region and the body region.

11. The method of claim 9, further comprising forming the source contact to electrically connect the source region and the body region.

12. The method of claim 8, further comprising forming a body region extending from the first major surface into the semiconductor layer; and forming the body region to abut the source region on a side opposite to the side of the source region which abuts the trench.

13. The method of claim 8, further comprising forming the semiconductor layer on the semiconductor substrate.

14. The method of claim 8, wherein the trench is formed to extend into and terminate in a drift region of the semiconductor layer.

15. The method of claim 8, further comprising forming the body region to abut the source region on a side opposite to the side of the source region which abuts the trench.

16. The method of claim 13, wherein the trench is formed to extend into and terminate in a drift region of the semiconductor layer.

* * * * *